(12) United States Patent
Jang (10) Patent No.: US 7,525,345 B2
(45) Date of Patent: Apr. 28, 2009

(54) SWING LIMITER

(75) Inventor: Seong-Jin Jang, Seognam-si (KR)

(73) Assignee: Samsung Electronic Co., Ltd (KR)

( * ) Notice: Subject to any disclaimer, the term of this patent is extended or adjusted under 35 U.S.C. 154(b) by 130 days.

(21) Appl. No.: 11/503,802

(22) Filed: Aug. 14, 2006

(65) Prior Publication Data

US 2007/0040579 A1    Feb. 22, 2007

(30) Foreign Application Priority Data

Aug. 18, 2005    (KR) ............ 10-2005-0075914

(51) Int. Cl.
*H03K 19/094*    (2006.01)
*H03K 19/0175*    (2006.01)
(52) U.S. Cl. ................. 326/83; 327/530
(58) Field of Classification Search ........... None
See application file for complete search history.

(56) References Cited

U.S. PATENT DOCUMENTS

| | | | |
|---|---|---|---|
| 5,012,141 A * | 4/1991 | Tomisawa | 327/276 |
| 5,081,380 A * | 1/1992 | Chen | 327/262 |
| 5,936,896 A | 8/1999 | Cho et al. | 365/189.11 |
| 5,939,937 A * | 8/1999 | Terletzki | 327/541 |
| 6,087,885 A * | 7/2000 | Tobita | 327/379 |
| 6,414,899 B2 | 7/2002 | Afghahi et al. | 365/230.06 |
| 2002/0084825 A1 * | 7/2002 | Hwang et al. | 327/328 |
| 2003/0080780 A1 * | 5/2003 | Okamoto et al. | 326/83 |
| 2006/0290415 A1 * | 12/2006 | Hazucha et al. | 327/539 |

FOREIGN PATENT DOCUMENTS

| | | |
|---|---|---|
| KR | 10-1998-0078101 | 11/1998 |
| KR | 10-1998-0083647 | 12/1998 |

OTHER PUBLICATIONS

Leroy Davis, Low Voltage Logic Thresholds, 1998 Electronic Prototype, Inc. http://www.interfacebus.com/voltage_LV_threshold.html.*

* cited by examiner

*Primary Examiner*—Rexford Barnie
*Assistant Examiner*—Dylan White
(74) *Attorney, Agent, or Firm*—Mills & Onello LLP (57) ABSTRACT

A swing limiter comprises a logic circuit including a first pull-up transistor and a first pull-down transistor connected between first and second nodes and which generate an output signal; a second pull-up transistor connected between a first power voltage and the first node; a second pull-down transistor connected between the second node and a second power voltage; a first control voltage generator connected between a high voltage which is higher than the first power voltage and a first reference voltage which is lower than the high voltage; and a second control voltage generator connected between a low voltage which is lower than the second power voltage and a second reference voltage which is higher than the low voltage.

25 Claims, 6 Drawing Sheets

SWING LIMITER

CROSS-REFERENCE TO RELATED APPLICATION

This application claims the priority to Korean Patent Application No. 2005-75914, filed Aug. 18, 2005, the disclosure of which is hereby incorporated herein by reference in its entirety.

BACKGROUND OF THE INVENTION

1. Field of the Invention

The present invention relates to a swing limiter and, more particularly, to a swing limiter which is employed in a semiconductor memory device.

2. Description of the Related Art

A typical logic circuit includes at least one pull-up transistor and at least one pull-down transistor. The pull-up transistor is connected to a power voltage and is turned on to generate an output signal at a power voltage level, whereas the pull-down transistor is connected to a ground voltage and is turned on to generate the output signal at the ground voltage level. As a result, the output signal fully swings between the power voltage level and the ground voltage level.

However, a full swing in the output signal can adversely affect high-speed operation, and can increase power consumption. For these reasons, efforts to reduce the swing width have been studied.

Figure 1:
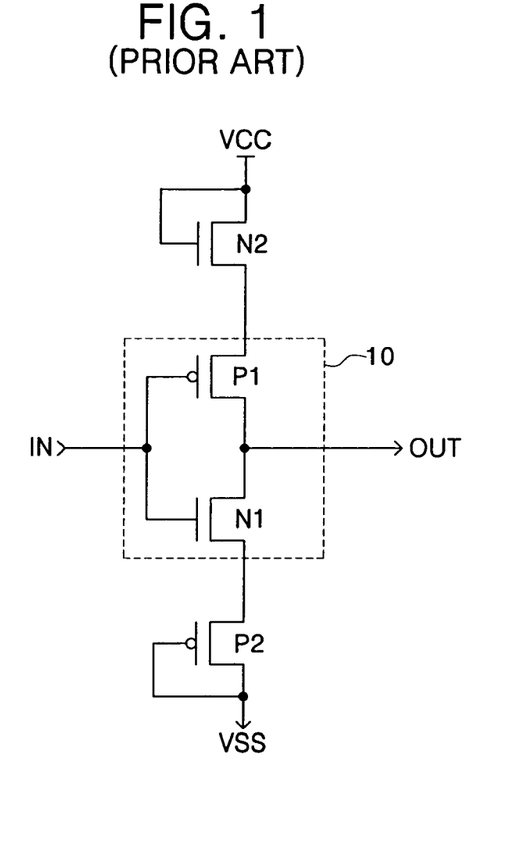
FIG. 1 is a circuit diagram illustrating a conventional swing limiter.

FIG. 1 is a circuit diagram illustrating a conventional swing limiter. The swing limiter of FIG. 1 includes a logic circuit 10 having a PMOS transistor P1 and an NMOS transistor N1, an NMOS transistor N2 having a diode configuration, and a PMOS transistor P2 having a diode configuration.

Function of the components of FIG. 1 will now be explained.

The NMOS transistor N2 applies a voltage "VCC−Vtn", which is obtained by subtracting a threshold voltage Vtn of the NMOS transistor N2 from a power voltage VCC, to the PMOS transistor P1, and the PMOS transistor P2 applies to the NMOS transistor N1 a voltage "VSS+|Vtp|" obtained by adding an absolute value of a threshold voltage Vtp of the PMOS transistor P2 to a ground voltage VSS.

The NMOS transistor N1 is turned on to generate an output signal OUT having a level of "VSS+|Vtp|" when an input signal IN having a high level is applied, and the PMOS transistor P1 is turned on to generate an output signal OUT having a level of "VCC−Vtn" when an input signal IN having a low level is applied. That is, the output signal OUT swings between the voltage "VSS+|Vtp|" level and the voltage "VCC-Vtn" level.

However, without the presence of the NMOS transistor N2 and PMOS transistor P2, the logic circuit 10 generates the output signal OUT having the ground voltage VSS level since the NMOS transistor N1 is turned on when the input signal IN having a high level is applied, and generates the output signal OUT having the power voltage VCC level since the PMOS transistor P1 is turned on when the input signal IN having a low level is applied. That is, in this case, the output signal OUT fully swings between the ground voltage VSS level and the power voltage VCC level.

Figure 2:
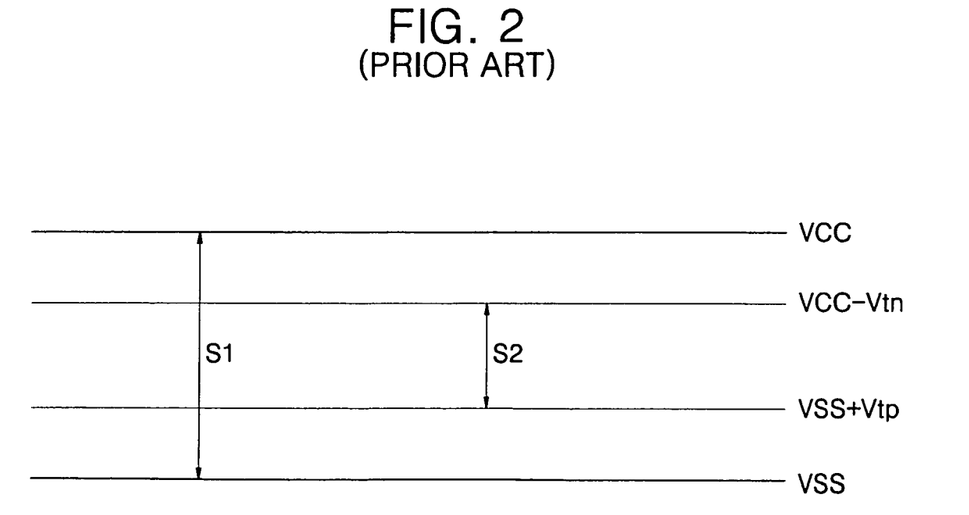
FIG. 2 illustrates the swing width of an output signal of the swing limiter.

FIG. 2 shows the swing width of the output signal OUT of the swing limiter. If the swing limiter comprises the logic circuit 10 without the NMOS transistor N2 and the PMOS transistor P2, the swing width is "S1", whereas if the swing limiter further comprises the NMOS transistor N2 and the PMOS transistor P2 as in the logic circuit of FIG. 1, the swing width of the output signal is reduced to S2.

The conventional swing limiter of FIG. 1 is limited in application, in that it is possible to raise the swing width of the output signal by a level of an absolute value of the threshold voltage of the PMOS transistor or to drop the swing width by a level of the threshold voltage of the NMOS transistor, but it is impossible to raise or drop the swing width by another desired, appropriate, level.

Further, there is a problem in the conventional swing limiter in that the swing level changes as the threshold voltages of the PMOS transistor and the NMOS transistor which include the diode configurations change due to variations in fabrication process, applied voltage or operating temperature.

SUMMARY OF THE INVENTION

It is an object of the present invention to provide a swing limiter which can raise or drop the swing width of the output signal by a desired, appropriate, level.

It is another object of the present invention to provide a swing limiter in which a change of the swing level resulting from a variation in fabrication process, applied voltage or operating temperature can be prevented.

In a first aspect, the present invention is directed to a swing limiter, comprising: a logic circuit including at least one first pull-up transistor and at least one pull-down transistor which are serially connected between a first node and a first power voltage and receive at least one input signal to generate an output signal; a second pull-up transistor connected between a second power voltage and the first node and causing a voltage of the first node to have a voltage level obtained by subtracting a voltage which is less than a threshold voltage thereof from the second power voltage in response to a control voltage; and a control voltage generator connected between a high voltage which is higher than the second power voltage and a reference voltage which is lower than the high voltage and generating the control voltage between the high voltage and the reference voltage. The swing limiter swings between the voltage level obtained by subtracting the voltage which is less than the threshold voltage of the second pull-up transistor from the second power voltage and the first power voltage level.

In one embodiment, the first pull-up transistor includes a PMOS transistor, and the first pull-down transistor and the second pull-up transistors include an NMOS transistor.

In another embodiment, the control voltage generator comprises first and second resistors and an NMOS transistor having a diode configuration which are serially connected between the high voltage and the reference voltage, wherein the NMOS transistor having a diode configuration has a threshold voltage which changes when the threshold voltage of the second pull-up transistor changes and generates the voltage of the second node between the first and second resistors as the control voltage.

Optionally, the control voltage generator includes first and second resistors and an NMOS transistor having a diode configuration which are serially connected between the high voltage and the reference voltage; a comparator for comparing a voltage between the first and second resistors to the control voltage to generate a comparison signal; and a PMOS transistor in which driving ability varies to generate the control voltage in response to the comparison signal, wherein the NMOS transistor having a diode configuration has a threshold voltage which changes when the threshold voltage of the second pull-up transistor changes and generates the voltage of the second node between the first and second resistors as the control voltage.

In a second aspect, the present invention is directed to a swing limiter, comprising: a logic circuit including at least one pull-up transistor and at least one first pull-down transistor which are serially connected between a first node and a first power voltage and receive at least one input signal to generate an output signal; a second pull-down transistor connected between a second power voltage and the first node and causing a voltage of the first node to have a voltage level obtained by adding a voltage which is less than an absolute value of a threshold voltage thereof to the second power voltage in response to a control voltage; and a control voltage generator connected between a low voltage which is lower than the second power voltage and a reference voltage which is higher than the low voltage and generating the control voltage between the low voltage and the reference voltage.

In one embodiment, the swing limiter swings between the first power voltage level and the voltage level obtained by adding the voltage which is less than the absolute value of the threshold voltage of the second pull-down transistor to the second power voltage level.

In another embodiment, the pull-up transistor and the second pull-down transistor comprise a PMOS transistor, and the first pull-down transistors comprise an NMOS transistor.

In another embodiment, the control voltage generator includes first and second resistors and a PMOS transistor having a diode configuration which are serially connected between the low voltage and the reference voltage, wherein the PMOS transistor having a diode configuration has a threshold voltage which changes when the threshold voltage of the second pull-down transistor changes and generates the voltage of the second node between the first and second resistors as the control voltage. Optionally, the control voltage generator includes first and second resistors and a PMOS transistor having a diode configuration which are serially connected between the low voltage and the reference voltage; a comparator for comparing a voltage between the first and second resistors to the control voltage to generate a comparison signal; and an NMOS transistor in which driving ability varies to generate the control voltage in response to the comparison signal, wherein the PMOS transistor having a diode configuration has a threshold voltage which changes when the threshold voltage of the second pull-down transistor changes and generates the voltage of the second node between the first and second resistors as the control voltage.

In a third aspect, the present invention is directed to a swing limiter, comprising: a logic circuit including at least one first pull-up transistor and at least one first pull-down transistor which are serially connected between a first node and a second node and receive at least one input signal to generate an output signal; a second pull-up transistor connected between a first power voltage and the first node and causing a voltage of the first node to have a voltage level obtained by subtracting a voltage which is less than a threshold voltage thereof from the second power voltage in response to a first control voltage; a second pull-down transistor connected between the second node and a second power voltage and causing a voltage of the second node to have a voltage level obtained by adding a voltage which is less than an absolute value of a threshold voltage thereof to the second power voltage in response to a second control voltage; a first control voltage generator connected between a high voltage which is higher than the first power voltage and a first reference voltage which is lower than the high voltage and generating the first control voltage between the high voltage and the first reference voltage; and a second control voltage generator connected between a low voltage which is lower than the second power voltage and a second reference voltage which is higher than the low voltage and generating the second control voltage between the low voltage and the second reference voltage.

In one embodiment, the swing limiter swings between the voltage level obtained by subtracting the voltage which is less than the threshold voltage of the second pull-up transistor from the second power voltage and the voltage level obtained by adding the voltage which is less than the absolute value of the threshold voltage of the second pull-down transistor to the second power voltage.

In another embodiment, the first pull-up transistor and the second pull-down transistor comprise a PMOS transistor, and the first pull-down transistor and the second pull-up transistor comprise an NMOS transistor.

In another embodiment, the first control voltage generator has the same configuration as the control voltage generator of the first aspect of the present invention, and the second control voltage generator has the same configuration as the control voltage generator of the second aspect of the present invention.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete. In the drawings, the thickness of layers and regions are exaggerated for clarity. Like numbers refer to like elements throughout the specification.

Figure 3:
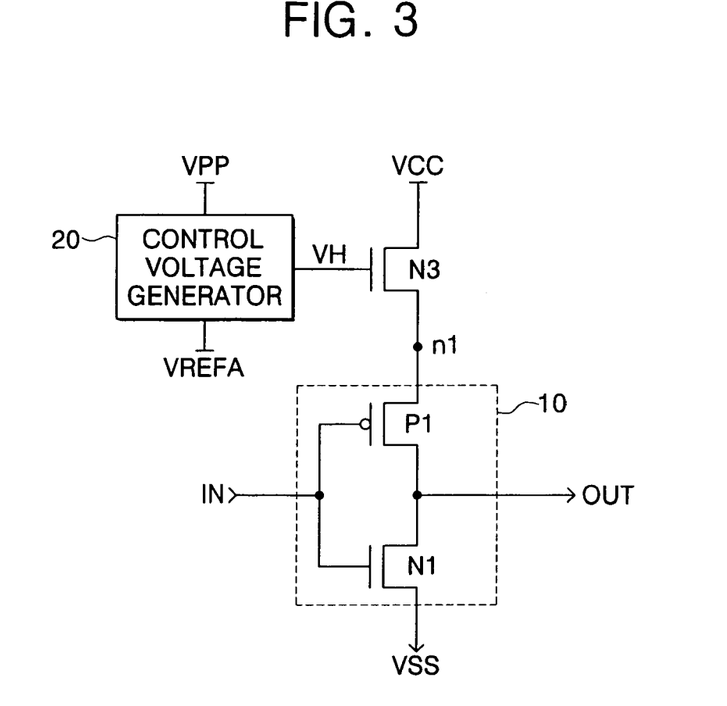
FIG. 3 is a circuit diagram illustrating a swing limiter according to a first embodiment of the present invention.

FIG. 3 is a circuit diagram illustrating a swing limiter according to a first embodiment of the present invention. The swing limiter of FIG. 3 includes a logic circuit 10, a control voltage generator 20, and an NMOS transistor N3.

In FIG. 3, the logic circuit 10 is connected between a node n1 and a ground voltage VSS, and the NMOS transistor N3 is connected between a power voltage VCC and the node n1 and receives a control voltage VH. The control voltage generator 20 is connected between a high voltage VPP and a reference voltage VREFA and generates the control voltage VH. Here, the high voltage VPP is a voltage having a higher level than the power voltage VCC, and the reference voltage VREFA is a voltage having a lower level than the high voltage VPP.

Functions of the components of FIG. 3 will now be explained.

The control voltage generator 20 generates the control voltage VH having a level between the high voltage VPP and the reference voltage VREFA. The NMOS transistor N3 causes the node n1 to have a voltage level obtained by subtracting a voltage which is less than a threshold voltage Vtn of the NMOS transistor N3 from the power voltage VCC in response to the control voltage VH. The logic circuit 10 generates an output signal of a voltage level obtained by subtracting a voltage which is less than the threshold voltage Vtn of the NMOS transistor N3 from the power voltage VCC when the PMOS transistor P1 is turned on in response to an input signal IN having a low level, and generates an output signal OUT of the ground voltage level VSS when the NMOS transistor N1 is turned on in response to the input signal IN having a high level.

That is, in the swing limiter of FIG. 3, a level corresponding to the high level of the output signal OUT is lowered to a level of the voltage obtained by subtracting a voltage which is less than the threshold voltage Vtn of the NMOS transistor N3 from the power voltage VCC.

Figure 4:
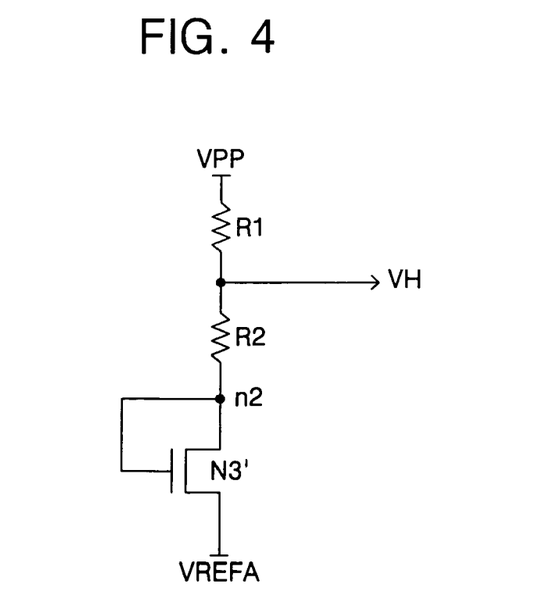
FIG. 4 is a circuit diagram illustrating a control voltage generator according to the first embodiment of the present invention.

FIG. 4 is a circuit diagram illustrating the control voltage generator 20 according to the first embodiment of the present invention. The control voltage generator of FIG. 4 includes resistors R1 and R2 and an NMOS transistor N3' having a diode configuration.

Functions of the components of FIG. 4 will now be explained.

The NMOS transistor N3' is configured to have the same characteristics as the NMOS transistor N3 of FIG. 3. The threshold voltage of the NMOS transistor N3' depends on the threshold voltage of the NMOS transistor N3. That is, the threshold voltage of the NMOS transistor N3' changes when the threshold voltage of the NMOS transistor N3 changes.

A node n2 has a level of a voltage "VREFA+Vtn'" obtained by adding the threshold voltage Vtn' of the NMOS transistor N3' to the reference voltage VREFA, and the control voltage VH has a level of a voltage "VREFA+Vtn'+(R2(VPP−(VREFA+Vtn'))/(R1+R2))". The control voltage VH therefore depends on the threshold voltage of the NMOS transistor N3'. That is, when the threshold voltage of the NMOS transistor N3 changes due to a variation in fabrication process, applied voltage or operational temperature, the threshold voltage of the NMOS transistor N3' changes, and thus the control voltage VH changes as well. Accordingly, the voltage of the node n2 maintains the swing level corresponding to the high level of the output signal OUT.

The reference voltage VREFA is lower than the high voltage VPP and may have the power voltage VCC level. If the reference voltage VREFA has the power voltage VCC level, the control voltage VH has a level between the high voltage VPP and the power voltage VCC. As a result, since a voltage of a higher level than the power voltage VCC is applied to a gate of the NMOS transistor N3, the NMOS transistor N3 causes the node n1 to have a voltage obtained by subtracting a voltage "a" which is less than the threshold voltage Vtn of the NMOS transistor N3 from the power voltage VCC. Also, the level of the voltage a is smaller as the level of the control voltage VH is raised, and the level of the voltage a is greater as the level of the control voltage VH is lowered.

Thus, the swing level corresponding to the high level of the output signal OUT is set to be high when the control voltage VH is set to be high, and the swing level corresponding to the high level of the output signal OUT is set to be low when the control voltage VH is set to be low.

Figure 5:
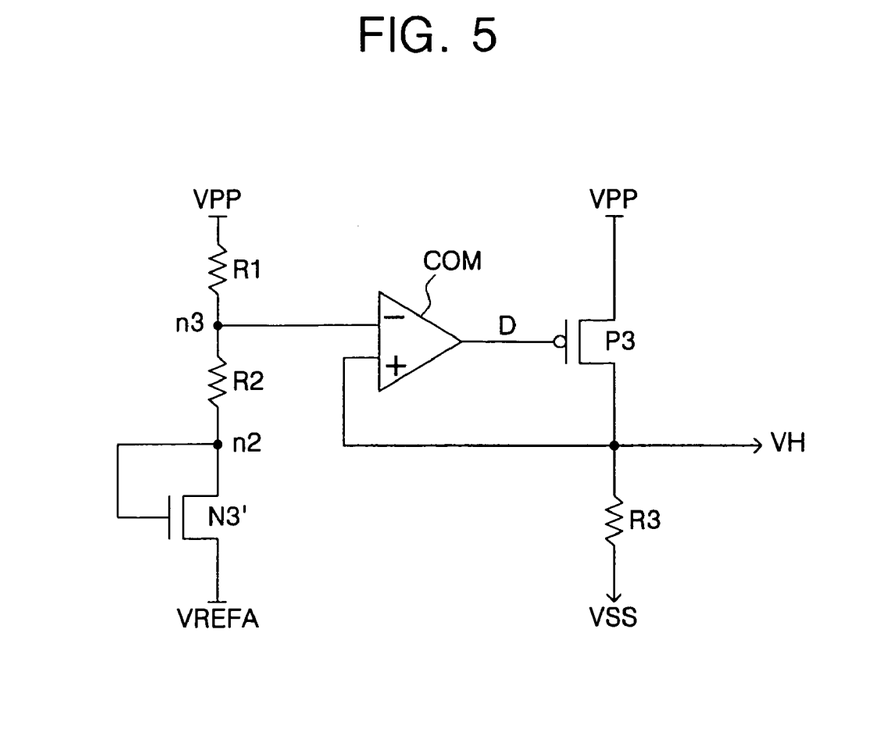
FIG. 5 is a circuit diagram illustrating modification of the control voltage generator according to the first embodiment of the present invention.

FIG. 5 is a circuit diagram illustrating modification of the control voltage generator according to the first embodiment of the present invention. The control voltage generator of FIG. 5 further includes a comparator COM, a PMOS transistor P3, and a resistor R3 in addition to the configuration of FIG. 4.

Functions of the components of FIG. 5 will now be explained.

A voltage of the node n3 is determined according to the approach of FIG. 4 described above. The comparator COM compares the voltage of the node n3 to the control voltage VH to lower a voltage level of a signal D when the level of the control voltage VH is lower than the level of the node n3, so that the PMOS transistor P3 is turned on to raise the level of the control voltage VH. The comparator COM raises a voltage level of the signal D when the level of the control voltage VH is higher than the level of the node n3, so that the PMOS transistor P3 is turned off. The resistor R3 is used to lower the level of the control voltage VH.

Figure 6:
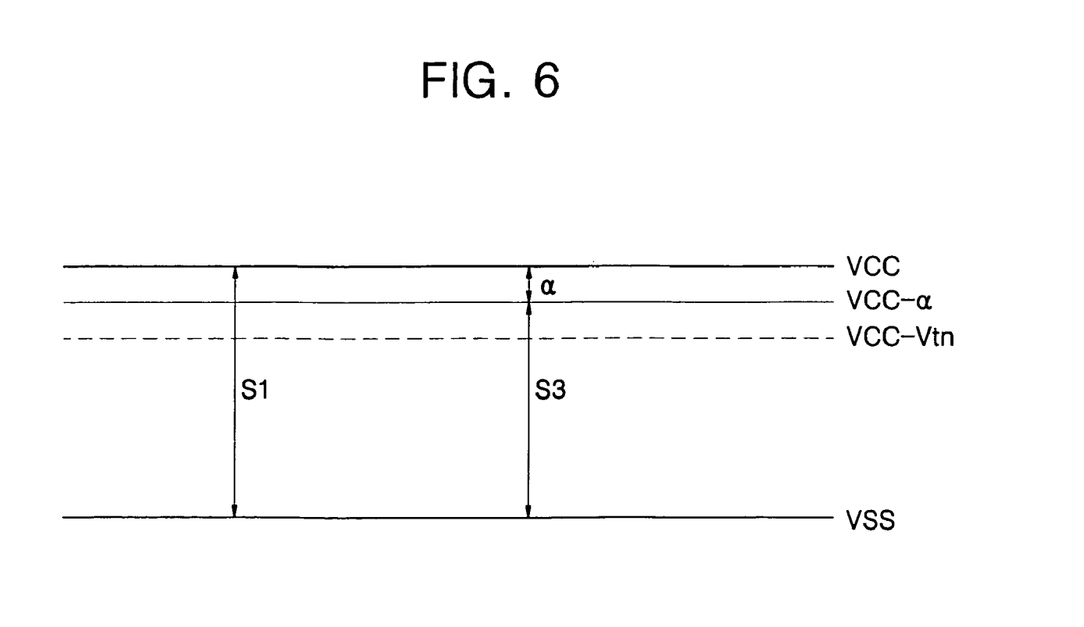
FIG. 6 illustrates the swing width of the swing limiter of FIG. 3.

FIG. 6 illustrates the swing width of the swing limiter of FIG. 3. If the swing width of the full swing is S1, the swing width is reduced to S3 by the configuration of FIG. 3. That is, the swing width of the output signal OUT becomes a level between the ground voltage VSS and the voltage obtained by subtracting a voltage a which is less than the threshold voltage Vtn of the NMOS transistor N3 from the power voltage VCC.

The swing limiter according to the first embodiment of the present invention can make a high level of the output signal OUT become a voltage "VCC-α" level obtained by subtracting the voltage which is less than the threshold voltage of the NMOS transistor N3 from the power voltage VCC.

Figure 7:
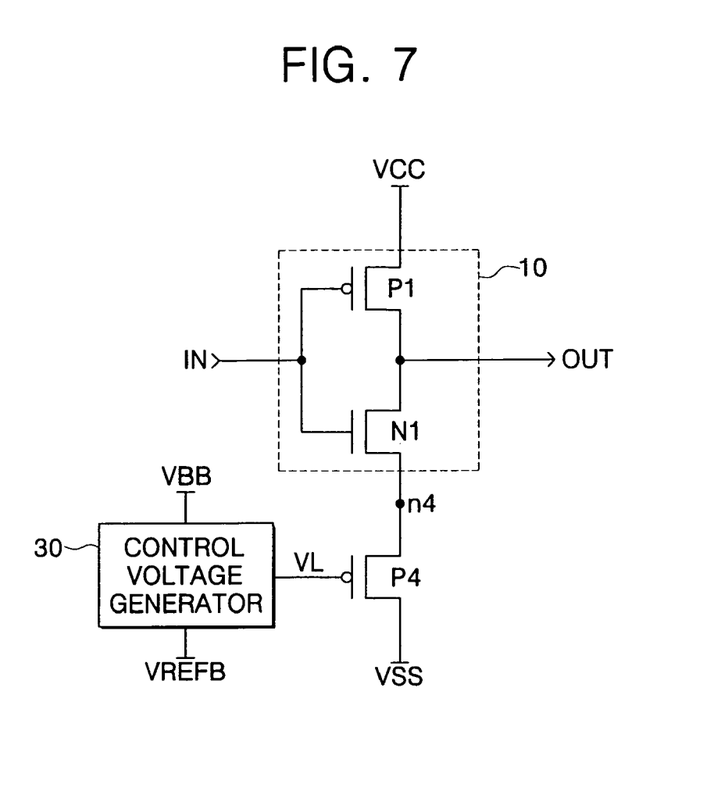
FIG. 7 is a circuit diagram illustrating a swing limiter according to a second embodiment of the present invention.

FIG. 7 is a circuit diagram illustrating a swing limiter according to a second embodiment of the present invention. The swing limiter of FIG. 7 includes a logic circuit 10, a control voltage generator 30, and a PMOS transistor P4.

In FIG. 7, the logic circuit 10 is connected between a node n4 and a power voltage VCC, and the PMOS transistor P4 is connected between the node n4 and a ground voltage VSS and receives a control voltage VL. The control voltage generator 30 is connected between a low voltage VBB and a reference voltage VREFB and generates the control voltage VL. Here, the low voltage VBB is a voltage having a lower level than the ground voltage VSS, and the reference voltage VREFB is a voltage having a higher level than the low voltage VBB.

Functions of the components of FIG. 7 will now be explained.

The control voltage generator 30 generates the control voltage VL having a level between the low voltage VBB and the reference voltage VREFB. The PMOS transistor P4 causes the node n4 to have a voltage level obtained by adding a voltage which is less than an absolute value of a threshold voltage Vtp of the PMOS transistor P4 to the ground voltage VSS in response to the control voltage VL. The logic circuit 10 generates an output signal OUT of the power voltage VCC level when the PMOS transistor P1 is turned on in response to an input signal IN of a low level, and generates an output signal OUT of a voltage level obtained by adding a voltage which is less than an absolute value of a threshold voltage Vtp of the PMOS transistor P4 to the ground voltage VSS when the NMOS transistor N1 is turned on in response to the input signal IN having a high level.

That is, in the swing limiter of FIG. 7, a level corresponding to the low level of the output signal OUT is raised to a level of a voltage obtained by adding a voltage which is less than an absolute value of a threshold voltage Vtp of the PMOS transistor P4 to the ground voltage VSS.

Figure 8:
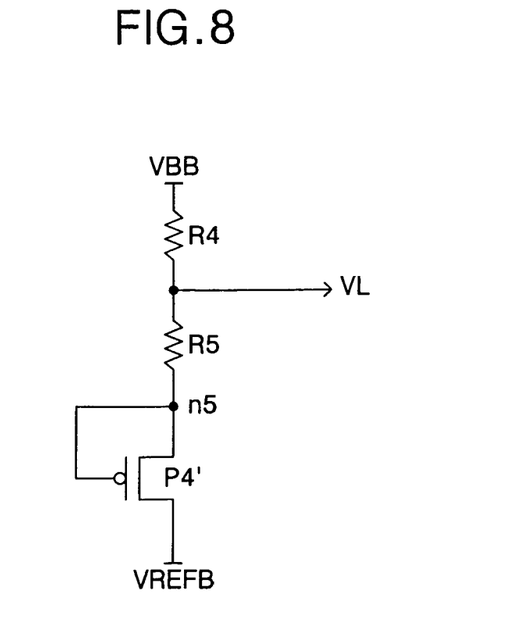
FIG. 8 is a circuit diagram illustrating a control voltage generator according to the second embodiment of the present invention.

FIG. 8 is a circuit diagram illustrating the control voltage generator according to the second embodiment of the present invention. The control voltage generator of FIG. 8 includes resistors R4 and R5 and a PMOS transistor P4' having a diode configuration.

Functions of the components of FIG. 8 will now be explained.

The PMOS transistor P4' is configured to have the same characteristics as the PMOS transistor P4 of FIG. 7. If the threshold voltage of the PMOS transistor P4 varies depending on a variation in a fabrication process, applied voltage or operating temperature, the threshold voltage of the NMOS PMOS transistor P4' also tracks the variation of the threshold voltage of the PMOS transistor P4. A node n5 has a level of a voltage "VREFB−|Vtp'|" obtained by subtracting the threshold voltage Vtp of the PMOS transistor P4' from the reference voltage VREFB, and the control voltage VL has a level "VREFB−|Vtp'|−R5(VBB−(VREFB−|Vtp'|)/(R4+R5))".

When the threshold voltage of the PMOS transistor P4 changes due to a variation in fabrication process, applied voltage or operating temperature, the threshold voltage of the PMOS transistor P4' changes, and thus the control voltage VH changes. Accordingly, the voltage of the node n5 maintains the swing level corresponding to the high level of the output signal OUT.

The reference voltage VREFB may have the ground voltage VSS level. In the case where the reference voltage VREFB has the ground voltage VSS level, the control voltage VL has a level between the low voltage VBB and the ground voltage VSS. As a result, since a voltage of a lower level than the ground voltage VSS is applied to a gate of the PMOS transistor P4, the PMOS transistor P4 causes the node n4 to have a voltage that is obtained by adding a voltage a which is less than an absolute value of the threshold voltage Vtp of the PMOS transistor P4 to the ground voltage VSS. Also, the level of the voltage a is greater as the level of the control voltage VL becomes higher, and the level of the voltage a is smaller as the level of the control voltage VL becomes lower.

Thus, the swing level corresponding to the low level of the output signal OUT is set to be low when the control voltage VL is set to be high, and the swing level corresponding to the low level of the output signal OUT is set to be high when the control voltage VL is set to be low.

Figure 9:
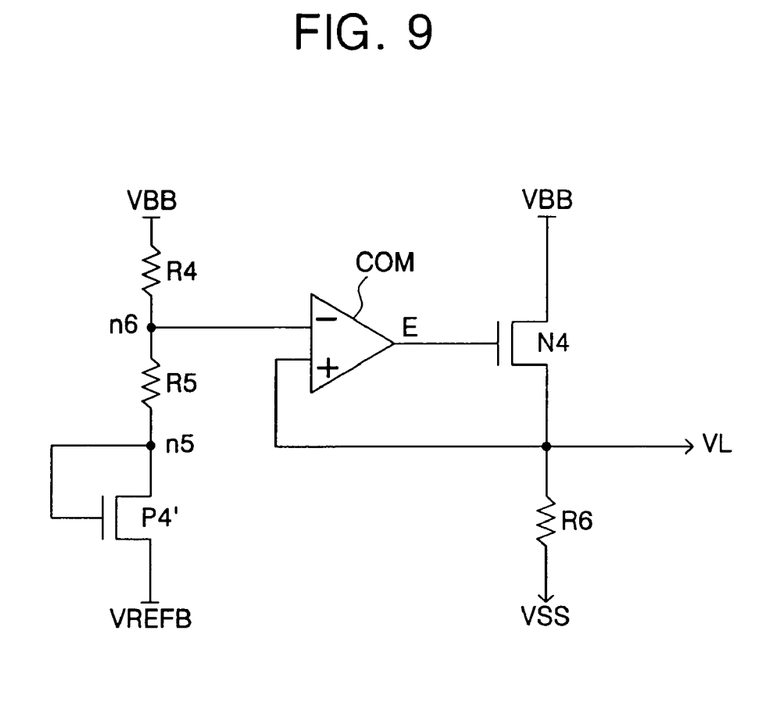
FIG. 9 is a circuit diagram illustrating modification of the control voltage generator according to the second embodiment of the present invention.

FIG. 9 is a circuit diagram illustrating modification of the control voltage generator according to the second embodiment of the present invention. The control voltage generator of FIG. 9 includes a comparator COM, an NMOS transistor N4, and a resistor R6 in addition to a configuration of FIG. 8.

Functions of the components of FIG. 9 will now be explained.

A voltage of the node n6 is determined by the method of FIG. 8 described above. The comparator COM compares a voltage of the node n6 to the control voltage VL and raises a voltage level of a signal E when the level of the control voltage VL is higher than the level of the node n6, so that the NMOS transistor N4 is turned on to lower the level of the control voltage VL. The comparator lowers a voltage level of the signal E when the level of the control voltage VL is lower than the level of the node n6, so that the NMOS transistor N4 is turned off. The resistor R6 is used to raise the level of the control voltage VL.

Figure 10:
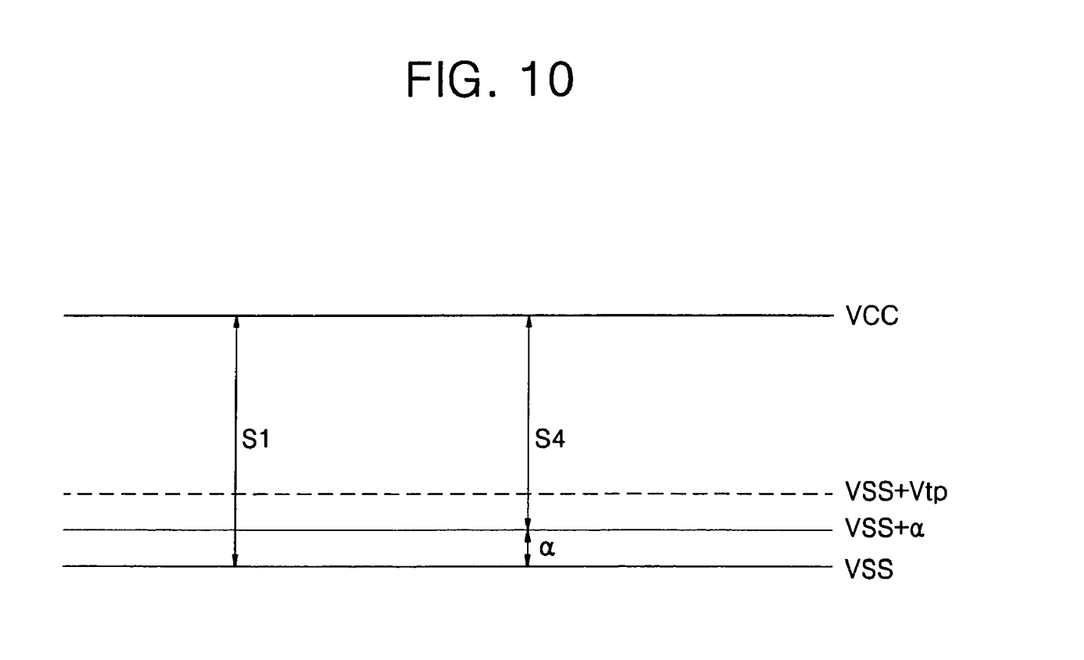
FIG. 10 illustrates the swing width of the swing limiter of FIG. 7.

FIG. 10 shows the swing width of the swing limiter of FIG. 7. If the swing width of the full swing is S1, the swing width is reduced to S4 by the configuration of FIG. 7. That is, the swing width of the output signal OUT becomes a level between the power voltage VCC and the voltage "VSS+α" obtained by adding a voltage which is less than an absolute value of the threshold voltage Vtp of the PMOS transistor P4 to the ground voltage VSS.

The swing limiter according to the second embodiment of the present invention can make a low level of the output signal OUT become a voltage "VCC+α" level obtained by adding the voltage which is less than absolute value of the threshold voltage Vtp of the PMOS transistor P4 to the ground voltage VSS.

Figure 11:
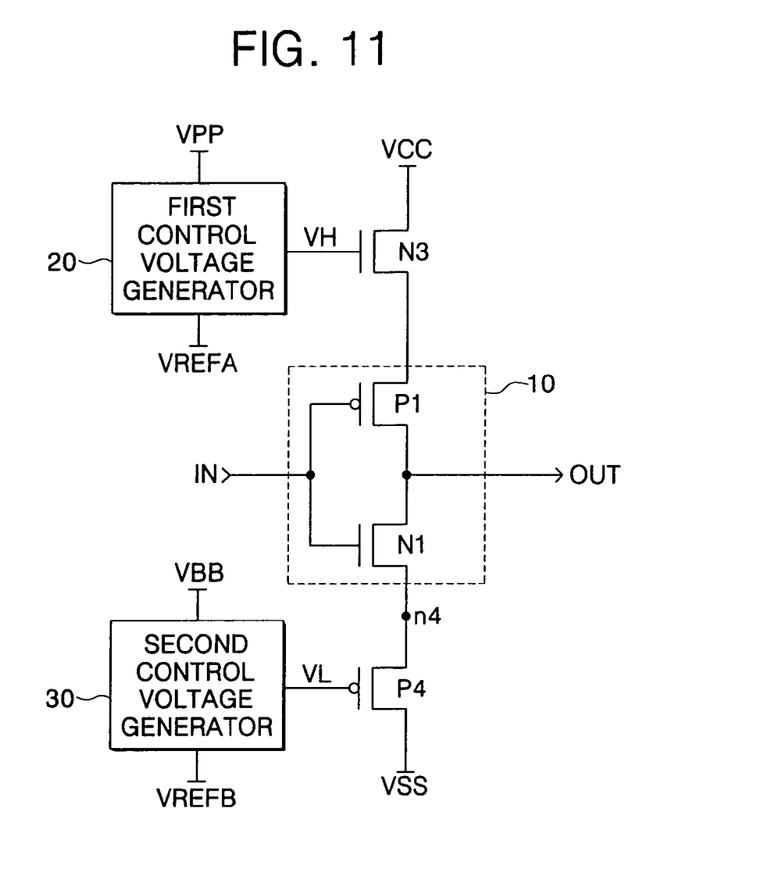
FIG. 11 is a circuit diagram illustrating a swing limiter according to a third embodiment of the present invention.

FIG. 11 is a circuit diagram illustrating a swing limiter according to a third embodiment of the present invention. The swing limiter of FIG. 11 is configured by adding the control voltage generator 30 and the PMOS transistor P4 of FIG. 7 to the configuration of the swing limiter of FIG. 3. In FIG. 11, the first control voltage generator 20 corresponds to the control voltage generator 20 of FIG. 3, and the second control voltage generator 30 corresponds to the control voltage generator 30 of FIG. 7.

Like reference numerals of FIGS. 3, 7 and 11 denote like parts and perform like operations, and description on those will be omitted.

The swing limiter of FIG. 11 causes a level corresponding to a high level of the output signal OUT to become a voltage level obtained by subtracting the voltage which is less than the threshold voltage of the NMOS transistor N3 from the power voltage VCC and causes a level corresponding to a low level of the output signal OUT to become a voltage level obtained by adding the voltage which is less than absolute value of the threshold voltage Vtp of the PMOS transistor P4 to the ground voltage VSS.

Figure 12:
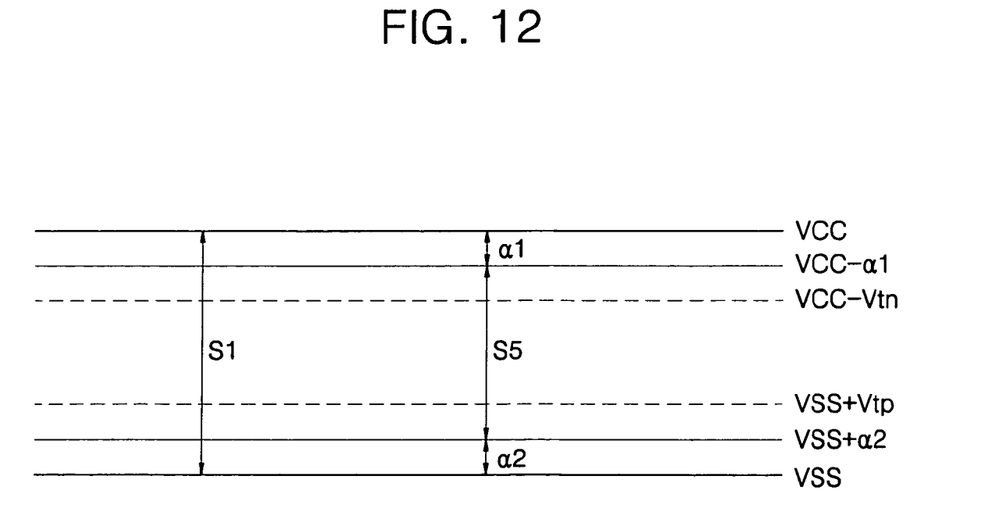
FIG. 12 illustrates the swing width of the swing limiter of FIG. 11.

FIG. 12 shows the swing width of the swing limiter of FIG. 11. If the swing width of the full swing is S1, the swing width is reduced to S5 by the configuration of FIG. 11. That is, the swing limiter of FIG. 11 can make the swing width of the output signal OUT become a level between a voltage "VCC−α1" obtained by subtracting the voltage a1 which is less than the threshold voltage Vth of the NMOS transistor N3 from the power voltage VCC and the voltage "VSS+α2" obtained by adding a voltage a2 which is less than an absolute value of the threshold voltage Vtp of the PMOS transistor P4 to the ground voltage VSS.

The swing limiter of the present invention can variably change the level of the control voltage VH through selection of the resistance values of the resistors R1 and R2 and by changing the level of the reference voltage VREFA and also can variously change the level of the control voltage VL by selecting the resistance values of the resistors R4 and R5 and changing the level of the reference voltage VREFB. Thus, the swing limiter of the present invention can vary the swing width of the output signal.

In a case where the swing limiter of the present invention can be employed in a semiconductor memory device, a high voltage used to drive the word line of the semiconductor memory device is used as the high voltage applied to the control voltage generators 20 and 30, and a substrate voltage is used as the low voltage. Thus, separate high voltage and low voltage generators for the swing limiter are not required.

In the embodiments of the present invention described above, it has been described that the logic circuit 10 is configured by an inverter, but the logic circuit 10 does not need to be an inverter and it can be configured by various gate circuits, such as NAND, NOR, AND, and OR gates, which have at least one pull-up transistor and at least pull-down transistor.

As described above, the swing limiter of the present invention can adjust the swing width to a desired appropriate level. The control voltage generator of the swing limiter of the present invention generates a relatively constant control voltage despite inherent variation in fabrication process, applied voltage or operating temperature, thereby constantly maintaining the swing level of the output signal.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A swing limiter, comprising:
   a logic circuit including at least one first pull-up transistor and at least one pull-down transistor which are serially connected between a first node and a first power voltage and receive at least one input signal to generate an output signal, respectively;
   a second pull-up transistor connected between a second power voltage and the first node and causing a voltage of the first node to have a voltage level obtained by subtracting a voltage which is less than a threshold voltage thereof from the second power voltage in response to a control voltage; and
   a control voltage generator connected between a high voltage which is higher than the second power voltage and a reference voltage which is lower than the high voltage and generating the substantially constant control voltage between the high voltage and the reference voltage, wherein the control voltage generator includes:
      first and second resistors and an NMOS transistor having a diode configuration which are serially connected between the high voltage and the reference voltage;
      a comparator for comparing a voltage between the first and second resistors to the control voltage to generate a comparison signal; and
      a PMOS transistor in which driving ability varies to generate the control voltage in response to the comparison signal,
      wherein the NMOS transistor having a diode configuration has a threshold voltage which changes when the threshold voltage of the second pull-up transistor changes and generates the voltage of the second node between the first and second resistors as the control voltage.

2. The swing limiter of claim 1, wherein the swing limiter swings between the voltage level obtained by subtracting the voltage which is less than the threshold voltage of the second pull-up transistor from the second power voltage and the first power voltage level.

3. The swing limiter of claim 2, wherein the first pull-up transistor comprises a PMOS transistor, and the first pull-down transistor and the second pull-up transistors comprise an NMOS transistor.

4. The swing limiter of claim 3, wherein the control voltage generator further includes a third resistor arranged between the control voltage and the first power voltage.

5. The swing limiter of claim 1, wherein the control voltage generator comprises a transistor that has similar threshold voltage characteristics as those of the second pull-up transistor of the swing limiter.

6. A swing limiter, comprising:
   a logic circuit including at least one pull-up transistor and at least one first pull-down transistor which are serially connected between a first node and a first power voltage and receive at least one input signal to generate an output signal, respectively;
   a second pull-down transistor connected between a second power voltage and the first node and causing a voltage of the first node to have a voltage level obtained by adding a voltage which is less than an absolute value of a threshold voltage thereof to the second power voltage in response to a control voltage; and
   a control voltage generator connected between a low voltage which is lower than the second power voltage and a reference voltage which is higher than the low voltage and generating the substantially constant control voltage between the low voltage and the reference voltage, wherein the control voltage generator includes:
      first and second resistors and a PMOS transistor having a diode configuration which are serially connected between the low voltage and the reference voltage;
      a comparator for comparing a voltage between the first and second resistors to the control voltage to generate a comparison signal; and
      an NMOS transistor in which driving ability varies to generate the control voltage in response to the comparison signal,
      wherein the PMOS transistor having a diode configuration has a threshold voltage which changes when the threshold voltage of the second pull-down transistor changes and generates the voltage of the second node between the first and second resistors as the control voltage.

7. The swing limiter of claim 6, wherein the swing limiter swings between the first power voltage level and the voltage level obtained by adding the voltage which is less than the absolute value of the threshold voltage of the second pull-down transistor to the second power voltage level.

8. The swing limiter of claim 7, wherein the pull-up transistor and the second pull-down transistor comprise a PMOS transistor, and the first pull-down transistor comprises an NMOS transistor.

9. The swing limiter of claim 8, wherein the control voltage generator further includes a third resistor arranged between the control voltage and the second power voltage.

10. The swing limiter of claim 6, wherein the control voltage generator comprises a transistor that has similar threshold voltage characteristics as those of the second pull-down transistor of the swing limiter.

11. A swing limiter, comprising:
    a logic circuit including at least one first pull-up transistor and at least one first pull-down transistor which are serially connected between a first node and a second node and receive at least one input signal to generate an output signal, respectively;
    a second pull-up transistor connected between a first power voltage and the first node and causing a voltage of the first node to have a voltage level obtained by subtracting a voltage which is less than a threshold voltage thereof from the first power voltage in response to a first control voltage;

a second pull-down transistor connected between the second node and a second power voltage and causing a voltage of the second node to have a voltage level obtained by adding a voltage which is less than an absolute value of a threshold voltage thereof to the second power voltage in response to a second control voltage;

a first control voltage generator connected between a high voltage which is higher than the first power voltage and a first reference voltage which is lower than the high voltage and generating the substantially constant first control voltage between the high voltage and the first reference voltage; and a second control voltage generator connected between a low voltage which is lower than the second power voltage and a second reference voltage which is higher than the low voltage and generating the substantially constant second control voltage between the low voltage and the second reference voltage, wherein the first control voltage generator includes first and second resistors and an NMOS transistor having a diode configuration which are serially connected between the high voltage and the first reference voltage;

a first comparator for comparing a voltage between the first and second resistors to the first control voltage to generate a first comparison signal; and a PMOS transistor in which driving ability varies to generate the first control voltage in response to the first comparison signal, wherein the NMOS transistor having a diode configuration has a threshold voltage which changes when the threshold voltage of the second pull-up transistor changes and generates a voltage of a third node between the first and second resistors as the first control voltage.

12. The swing limiter of claim 11, wherein the swing limiter swings between the voltage level obtained by subtracting the voltage which is less than the threshold voltage of the second pull-up transistor from the second power voltage and the voltage level obtained by adding the voltage which is less than the absolute value of the threshold voltage of the second pull-down transistor to the second power voltage.

13. The swing limiter of claim 12, wherein the first pull-up transistor and the second pull-down transistor comprise a PMOS transistor, and the first pull-down transistor and the second pull-up transistor comprise an NMOS transistor.

14. The swing limiter of claim 13, wherein the first control voltage generator further includes a third resistor arranged between the first control voltage and the first power voltage.

15. The swing limiter of claim 13, wherein the second control voltage generator includes third and fourth resistors and a PMOS transistor having a diode configuration which are serially connected between the low voltage and the second reference voltage;

a second comparator for comparing a voltage between the third and fourth resistors to the second control voltage to generate a second comparison signal; and an NMOS transistor in which driving ability varies to generate the second control voltage in response to the second comparison signal, wherein the PMOS transistor having a diode configuration has a threshold voltage which changes when the threshold voltage of the second pull-down transistor changes and generates a voltage of a fourth node between the third and fourth resistors as the second control voltage.

16. The swing limiter of claim 15, wherein the second control voltage generator further includes a fifth resistor arranged between the second control voltage and the second power voltage.

17. The swing limiter of claim 11, wherein the first control voltage generator comprises a transistor that has similar threshold voltage characteristics as those of the second pull-up transistor of the swing limiter, and a second control voltage generator comprises a transistor that has similar threshold voltage characteristics as those of the second pull-down transistor of the swing limiter.

18. A swing limiter, comprising:

a logic circuit including at least one first pull-up transistor and at least one pull-down transistor which are serially connected between a first node and a first power voltage and receive at least one input signal to generate an output signal, respectively;

a second pull-up transistor connected between a second power voltage and the first node and causing a voltage of the first node to have a voltage level obtained by subtracting a voltage which is less than a threshold voltage thereof from the second power voltage in response to a control voltage; and a control voltage generator connected between a high voltage which is higher than the second power voltage and a reference voltage which is lower than the high voltage and generating the control voltage between the high voltage and the reference voltage, wherein the swing limiter swings between the voltage level obtained by subtracting the voltage which is less than the threshold voltage of the second pull-up transistor from the second power voltage and the first power voltage level, wherein the first pull-up transistor comprises a PMOS transistor, and the first pull-down transistor and the second pull-up transistors comprise an NMOS transistor, wherein the control voltage generator includes:

first and second resistors and an NMOS transistor having a diode configuration which are serially connected between the high voltage and the reference voltage;

a comparator for comparing a voltage between the first and second resistors to the control voltage to generate a comparison signal; and a PMOS transistor in which driving ability varies to generate the control voltage in response to the comparison signal, wherein the NMOS transistor having a diode configuration has a threshold voltage which changes when the threshold voltage of the second pull-up transistor changes and generates the voltage of the second node between the first and second resistors as the control voltage.

19. The swing limiter of claim 18, wherein the control voltage generator further includes a third resistor arranged between the control voltage and the first power voltage.

20. A swing limiter, comprising:

a logic circuit including at least one pull-up transistor and at least one first pull-down transistor which are serially connected between a first node and a first power voltage and receive at least one input signal to generate an output signal, respectively;

a second pull-down transistor connected between a second power voltage and the first node and causing a voltage of the first node to have a voltage level obtained by adding a voltage which is less than an absolute value of a threshold voltage thereof to the second power voltage in response to a control voltage; and a control voltage generator connected between a low voltage which is lower than the second power voltage and a reference voltage which is higher than the low voltage and generating the control voltage between the low voltage and the reference voltage, wherein the swing limiter swings between the first power voltage level and the voltage level obtained by adding the voltage which is less than the absolute value of the threshold voltage of the second pull-down transistor to the second power voltage level, wherein the pull-up transistor and the second pull-down transistor comprise a PMOS transistor, and the first pull-down transistor comprises an NMOS transistor, wherein the control voltage generator includes:

first and second resistors and a PMOS transistor having a diode configuration which are serially connected between the low voltage and the reference voltage;

a comparator for comparing a voltage between the first and second resistors to the control voltage to generate a comparison signal; and an NMOS transistor in which driving ability varies to generate the control voltage in response to the comparison signal, wherein the PMOS transistor having a diode configuration has a threshold voltage which changes when the threshold voltage of the second pull-down transistor changes and generates the voltage of the second node between the first and second resistors as the control voltage.

21. The swing limiter of claim 20, wherein the control voltage generator further includes a third resistor arranged between the control voltage and the second power voltage.

22. A swing limiter, comprising:

a logic circuit including at least one first pull-up transistor and at least one first pull-down transistor which are serially connected between a first node and a second node and receive at least one input signal to generate an output signal, respectively;

a second pull-up transistor connected between a first power voltage and the first node and causing a voltage of the first node to have a voltage level obtained by subtracting a voltage which is less than a threshold voltage thereof from the first power voltage in response to a first control voltage;

a second pull-down transistor connected between the second node and a second power voltage and causing a voltage of the second node to have a voltage level obtained by adding a voltage which is less than an absolute value of a threshold voltage thereof to the second power voltage in response to a second control voltage;

a first control voltage generator connected between a high voltage which is higher than the first power voltage and a first reference voltage which is lower than the high voltage and generating the first control voltage between the high voltage and the first reference voltage; and a second control voltage generator connected between a low voltage which is lower than the second power voltage and a second reference voltage which is higher than the low voltage and generating the second control voltage between the low voltage and the second reference voltage, wherein the swing limiter swings between the voltage level obtained by subtracting the voltage which is less than the threshold voltage of the second pull-up transistor from the second power voltage and the voltage level obtained by adding the voltage which is less than the absolute value of the threshold voltage of the second pull-down transistor to the second power voltage, wherein the first pull-up transistor and the second pull-down transistor comprise a PMOS transistor, and the first pull-down transistor and the second pull-up transistor comprise an NMOS transistor, wherein the control voltage generator includes:

first and second resistors and an NMOS transistor having a diode configuration which are serially connected between the high voltage and the first reference voltage;

a first comparator for comparing a voltage between the first and second resistors to the first control voltage to generate a first comparison signal; and a PMOS transistor in which driving ability varies to generate the first control voltage in response to the first comparison signal, wherein the NMOS transistor having a diode configuration has a threshold voltage which changes when the threshold voltage of the second pull-up transistor changes and generates a voltage of a third node between the first and second resistors as the first control voltage.

23. The swing limiter of claim 22, wherein the first control voltage generator further includes a third resistor arranged between the first control voltage and the first power voltage.

24. The swing limiter of claim 22, wherein the second control voltage generator includes:

third and fourth resistors and a PMOS transistor having a diode configuration which are serially connected between the low voltage and the second reference voltage;

a second comparator for comparing a voltage between the third and fourth resistors to the second control voltage to generate a second comparison signal; and an NMOS transistor in which driving ability varies to generate the second control voltage in response to the second comparison signal, wherein the PMOS transistor having a diode configuration has a threshold voltage which changes when the threshold voltage of the second pull-down transistor changes and generates a voltage of a fourth node between the third and fourth resistors as the second control voltage.

25. The swing limiter of claim 24, wherein the second control voltage generator further includes a fifth resistor arranged between the second control voltage and the second power voltage.

* * * * *